United States Patent [19]
Lee et al.

[11] Patent Number: 5,846,887
[45] Date of Patent: Dec. 8, 1998

[54] METHOD FOR REMOVING DEFECTS BY ION IMPLANTATION USING MEDIUM TEMPERATURE OXIDE LAYER

[75] Inventors: Kil Ho Lee; Byung Jin Cho, both of Kyoungkido, Rep. of Korea

[73] Assignee: Hyundai Electronics Industries Co., Ltd., Rep. of Korea

[21] Appl. No.: 757,161

[22] Filed: Nov. 27, 1996

[30] Foreign Application Priority Data

Nov. 30, 1995 [KR] Rep. of Korea ............... 1995-45482
Nov. 30, 1995 [KR] Rep. of Korea ............... 1995-50433

[51] Int. Cl.⁶ ............................................. H01L 21/31
[52] U.S. Cl. ................................... 438/769; 438/770
[58] Field of Search ................................ 438/769, 770, 438/775, 787

[56] References Cited

U.S. PATENT DOCUMENTS 5,030,476  7/1991  Okamura et al. ................. 427/39

Primary Examiner—John Niebling
Assistant Examiner—Michael S. Lebentritt
Attorney, Agent, or Firm—Blakely Sokoloff Taylor & Zafman

[57] ABSTRACT

Disclosed is a method for the shallow junction having a low sheet resistance and an improved electric characteristics, using the medium temperature CVD oxide layer deposited on the source/drain regions into which impurity ions are implanted. The medium temperature CVD oxide layer, which has a compressive stress of $1.53 \times 10^9$ dyne/cm$^2$, causes the surface of the silicon substrate to be subject to tensile stress. By forming the medium temperature CVD oxide layer on the silicon substrate at a temperature of approximately 760°–820° C., the defects in the inside of the substrate move to the surface of the silicon substrate. As a result, the concentration of the defects in the inside of the silicon substrate decreases so that the small size extended defects are on the surface of the silicon substrate. These extended defects can be naturally removed from the surface of the silicon substrate by performing a follow-up process such as a metalization or an additional thermal treatment process.

21 Claims, 5 Drawing Sheets

METHOD FOR REMOVING DEFECTS BY ION IMPLANTATION USING MEDIUM TEMPERATURE OXIDE LAYER

BACKGROUND OF THE INVENTION

1. Field of the Invention

The present invention relates to a method for manufacturing a semiconductor devices, and more particularly to a method of minimizing the leakage current generated in the source/drain junctions of the devices and their junction depth.

2. Description of the Prior Art

Generally, with the development of integrated circuits, the junction depth of the source/drain plays an important role in improving the electrical characteristics of the devices.

FIG. 1 is a cross-sectional view illustrating the method for forming a semiconductor device according to the prior art, wherein is shown a MOS transistor formed in an N-well. As shown in FIG. 1, a field oxide layer 3, a gate oxide layer 4, a gate electrode 5 and a spacer 6, in order, are formed on an N-well 2 in a silicon substrate 1, using the conventional method of forming a MOSFET.

At this time, an oxide layer 11, such as a thermal oxide buffer layer, is formed on the source/drain regions, to prevent the silicon substrate 1 from being damaged by the etching process forming the gate electrode 5. Also, the oxide layer 11 can be generated by leaving a part of an insulating layer on said silicon substrate, when the anisotropic etching process is applied to the insulating layer for the spacer 6. Then, the spacer 6 is formed on the sidewall of said gate electrode, and the oxide layer 11 is formed on the surface of the silicon substrate 1, preventing the silicon substrate 1 from being damaged by the anisotropic etching process. The oxide layer is generally formed of a native oxide layer, an intentionally grown oxide layer, or a residual oxide by techniques well known in the art. Furthermore, when the ion implantation process is carried out for forming highly doped region 7' for the source/drain, the oxide layer 11 serves as a protection layer which prevents metallic impurities from being introduced into the substrate during the subsequent ion implantation. The reference numeral 7 in FIG. 1 denotes a lightly doped region for the source/drain.

Next, a first insulating layer 8, such as a tetraethoxysilane (TEOS) layer, is formed on the resulting structure. A second insulating layer 9 with a high fluidity, such as a borophosphosilicate glass layer (hereinafter, referred to as a BPSG layer), is formed on the first insulating layer 8. Finally, the furnace annealing process (FA) is carried out at a temperature of about 850° C.

However, this method has difficulty in forming the very shallow p+n junction. In the formation of the shallow p+n junction, $BF_2$ ions should be implanted into the silicon substrate with a low energy. Although the ion implanter, which has been typically used in the semiconductor manufacturing field, can implant the ions with acceleration energy of 10 KeV, it is very difficult to use this low energy in the actual process because of the very low ion beam current. Also, in the thermal treatment subsequent to the ion implantation, a low temperature process become effective to the shallow junction, but there are the limitations of the temperature thereof because of the critical conditions for the planarization of the BPSG layer. In the low-temperature thermal treatment, it is very difficult to prevent an increase in the sheet resistance (Rs) and the junction leakage current because of the diminution of dopants' activation and the capability of removing the defects.

Particularly, since the fluorine (F) in $BF_2$ ions makes the silicon substrate amorphized, the defects, such as silicon interstitials, are generated and distributed at the bottom of the interface between the amorphous structure and the crystalline structure of the silicon substrate. The defects locate at the depletion region after the thermal treatment, thereby increasing the junction leakage current.

SUMMARY OF THE INVENTION

Therefore, it is an object of the present invention to provide a method for forming a semiconductor device having an improved electric characteristics and reliability, by controlling the deposition temperature in forming an oxide layer on a silicon substrate.

It is another object of the present invention to provide a method for forming the shallow junction by preventing the dopants from diffusing into the silicon substrate during the thermal treatment process.

It is further another object of the present invention to provide a method for forming a junction with a low sheet resistance.

In accordance with an aspect of the present invention, there is provided a method for forming a semiconductor device, comprising the steps of: forming a buffer oxide layer on a silicon substrate; implanting impurity ions into said silicon substrate to form source and drain regions, wherein defects are created in said silicon substrate; removing said buffer oxide layer; and moving said defects to an upper surface of said silicon substrate by forming a CVD oxide layer, wherein said oxide layer is contacted to said source and drain regions.

In accordance with another aspect of the present invention, there is provided a method for forming a semiconductor device, comprising the steps of: forming a buffer oxide layer on a silicon substrate; implanting impurity ions into said silicon substrate to form source and drain regions, wherein defects are created in said silicon substrate; removing said buffer oxide layer; moving said defects to an upper surface of said silicon substrate by forming a CVD oxide layer wherein said oxide layer is contacted to said source and drain regions; forming an ion-doped $SiO_2$ layer on said medium temperature CVD oxide layer; performing a thermal treatment process for planarization of said ion-doped $SiO_2$ layer; forming a low temperature CVD oxide layer on ion-doped $SiO_2$ layer; and removing said defects moved to said upper surface of said silicon substrate by performing a rapid thermal annealing process.

In accordance with further another aspect of the present invention, there is provided a method for forming a semiconductor device, comprising the steps of: forming a gate insulating layer on a silicon substrate; forming a gate electrode on said gate insulating layer; forming lightly doped regions for a source and a drain by implanting low concentration ions into said silicon substrate wherein defects are created in said silicon substrate; forming an insulating layer on said silicon substrate; applying the anisotropic etching process to said insulating layer, leaving a part of said insulating layer on said silicon substrate, so that an insulating spacer is formed on the sidewall of said gate electrode and a buffer oxide layer is formed on the surface of said silicon substrate; forming highly doped regions for a source and a drain by implanting high concentration ions into said silicon substrate through said buffer oxide layer; removing said buffer oxide layer; and moving said defects to an upper surface of said silicon substrate by forming a CVD oxide layer, wherein said oxide layer is contacted to said source and drain regions.

In accordance with still further another aspect of the present invention, there is provided a method for forming a semiconductor device, comprising the steps of: forming a gate insulating layer on a silicon substrate; forming a gate electrode on said gate insulating layer; forming lightly doped regions for a source and a drain, implanting low concentration ions into said silicon substrate, wherein defects are created in said silicon substrate; forming an insulating layer on said gate electrode and said silicon substrate structure; applying the anisotropic etching process to said first insulating layer, leaving a part of said insulating layer on said silicon substrate, so that an insulating spacer is formed on the sidewall of said gate electrode and a buffer oxide layer is formed on the surface of said silicon substrate; forming highly doped regions for said source and said drain, implanting high concentration ions into said silicon substrate through said buffer oxide layer, wherein defects are created in said silicon substrate; removing said buffer oxide layer; moving said defects to an upper surface of said silicon substrate by forming a CVD oxide layer, wherein said oxide layer is contacted to said source and drain regions; forming an ion-doped $SiO_2$ layer on said CVD oxide layer; performing a thermal treatment process for planarization of said ion-doped $SiO_2$ layer; forming a low temperature CVD oxide layer on ion-doped $SiO_2$ layer; and said defects moved to said upper surface of said silicon substrate by performing a rapid thermal annealing process.

In accordance with still further another aspect of the present invention, there is provided a method for forming a semiconductor device, comprising the steps of: providing a semiconductor substrate having a surface; forming an oxide layer overlying said surface of said semiconductor substrate; introducing impurities by implantation into said semiconductor substrate through said oxide layer to form an active region, said active region having a junction region at a first location beneath said surface, said step of introducing causing a plurality of defects in said semiconductor substrate at a second location beneath said surface, said first location being adjacent to said second location; removing said oxide layer from said surface; and forming a medium temperature interdielectric layer on and contact with said surface, whereupon said medium temperature interdielectric layer forming step causes a substantial portion of said defects to migrate away from said first location toward said surface.

BRIEF DESCRIPTION OF THE DRAWINGS

Other objects and aspects of the invention will become apparent from the following description of embodiments with reference to the accompanying drawings, in which.

DESCRIPTION OF THE PREFERRED EMBODIMENT

Hereinafter, an embodiment of the present invention will be described below, referring to FIGS. 2A and 2B.

Figure 2A:
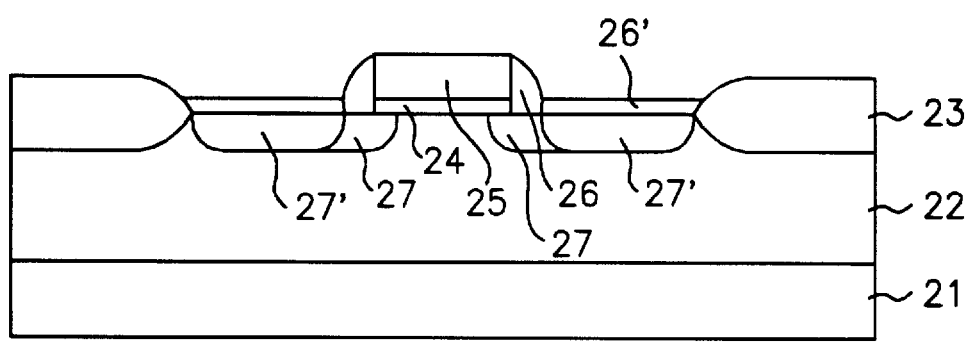
FIG. 2A is a cross-sectional view illustrating the implanting steps of the method for forming a semiconductor device according to the present invention.
Figure 2B:
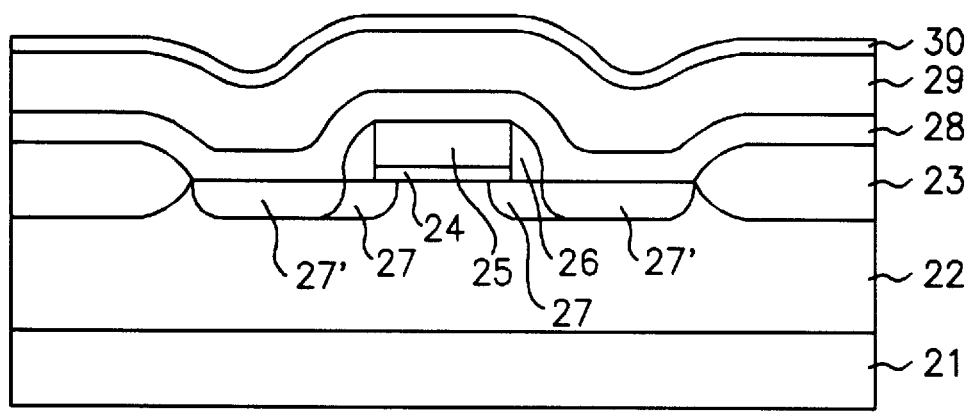
FIG. 2B is a cross-sectional view illustrating the steps of forming oxide layers on the structure of FIG. 2A and the thermal treatment processes according to the present invention.

FIGS. 2A and 2B are a cross-sectional view illustrating the method for forming a semiconductor device according to the present invention. First referring to FIG. 2A, an N-well 22, a field oxide layer 23, a gate oxide layer 24, a gate electrode 25 and an insulating spacer 26 are formed, in order, on a silicon substrate 21, by using a conventional method. The spacer 26 is used for forming the LDD (Lightly Doped Drain) structure, which is well known to those skilled in the art. At this time, a buffer oxide layer 26', such as the a native oxide layer, a residual oxide layer and a thermal oxide layer is formed on the silicon substrate 21 at a thickness of about 20–150 Å for the same purpose as that stated above. Then, $BF_2$ ions are implanted into the silicon substrate 21 through the thermal oxide layer to form the highly doped regions 27' for the source/drain. The reference numeral 27 in FIG. 2A denotes lightly doped regions for the source/drain.

Next, referring to FIG. 2B, after implanting the ions, it should be noted that the buffer oxide layer 26' is etched with an HF solution and the source/drain regions are exposed and immediately. In a sequence a medium temperature CVD oxide layer 28 is formed on the resulting structure at a temperature of about 760°–820° C., at a thickness of about 300–800 Å and at a flow rate of 1:50 to 1:100 for $SiH_4$ to $N_2O$, so that it is contacted to the exposed source/drain regions. In the preferred embodiment, the medium temperature CVD oxide layer 28 has a thickness of about 500 Å at a temperature of about 780° C.

Figure 1:
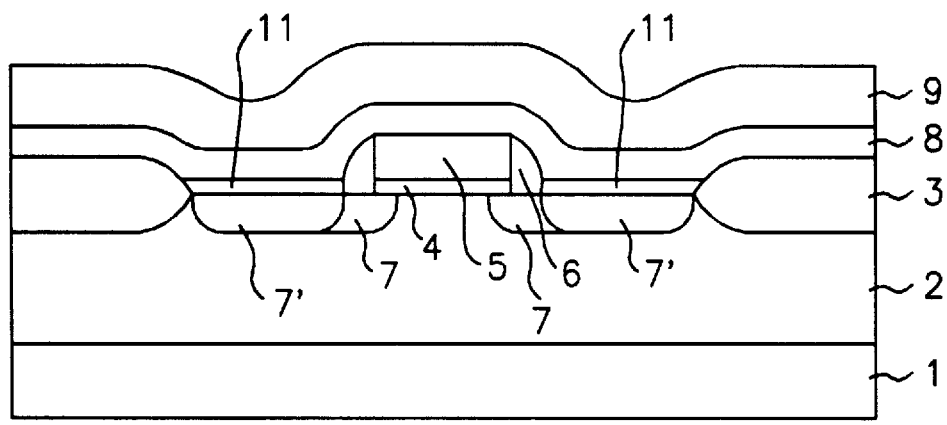
FIG. 1 is a cross-sectional view illustrating the method for forming a semiconductor device according to the prior art.

On the other hand, in the case of using a LPCVD (Low pressure Chemical Vapor Deposition) TEOS as a first interlayer insulating layer as stated in FIG. 1, the extended defects have been created at the bottom of the interface of the amorphous structure and the crystalline structure, and the defects, which don't take part in the extended defect, exists below the interface. That is, since the silicon substrate is subject to compressive stress due to the LPCVD TEOS layer having a tensile stress of $2 \times 10^8$ dyne/cm$^2$ and the defects can not be moved to the surface of the silicon substrate at a low temperature process of 710° C., the defects exist at the bottom of the interface of the amorphous structure and the crystalline structure.

However, in the present invention, while the medium temperature CVD oxide layer 28 is deposited as a first interlayer insulating layer, the point defects (interstitials), which are created by the ion implantation, are moved to the surface of the silicon substrate 21. The medium temperature CVD oxide layer (MTO) 28 having a compressive stress of $1.53 \times 10^9$ dyne/cm$^2$ causes the surface of the silicon substrate 21 to be subject to tensile stress and the deposition thereof is performed at a temperature of about 780° C., so that the out-diffusion, which causes the defects to move to the surface, is generated. As a result, the concentration of the defects in the inside of the silicon substrate 21 decreases, and the small size extended defects are on the surface of the silicon substrate 21. The extended defects may be naturally removed from the surface of the silicon substrate 21 by performing the rapid thermal annealing.

In the present invention, although the extended defects move to the surface of the silicon substrate, its sheet resistance doesn't increase because a great number of the extended defects, which have trapped the boron ions in the inside of the silicon substrate, decrease considerably.

Figure 3A:
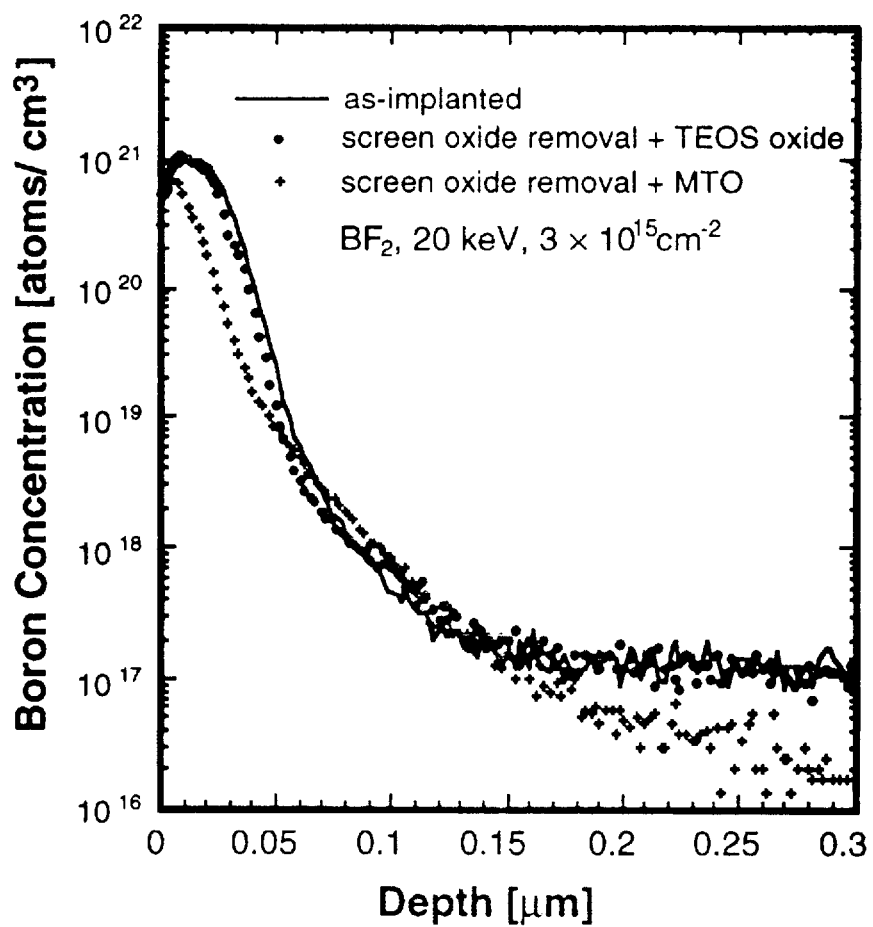
FIG. 3A is a plot showing the Boron depth profiles of As-implanted and the samples deposited with TEOS oxide and MTO after stripping off the pad (screen) oxide layer.

FIG. 3A is a plot showing the Boron depth profiles of as implanted and the samples deposited with TEOS oxide and MTO after stripping off the pad (screen) oxide layer, wherein it is shown that the junction depth of the present invention is less than that of the prior art using the TEOS layer.

Another embodiment of the present invention will be described below.

In the case where an insulating layer for planarization is formed on the medium temperature CVD oxide layer 28, a high-temperature thermal treatment is needed to improve the planarization of the insulating layer. Typically, the insulating layer for planarization is made of a BPSG or a PSG (phophosilicate glass) layer. That is to say, after forming the medium temperature CVD oxide layer 28, a BPSG layer 29 is formed on the resulting structure at a temperature of about 850° C. and then is thermally treated for planarization.

To remove the defects on the silicon surface, an additional thermal treatment must be performed, irrespective of the thermal treatment for planarization of the BPSG layer. Accordingly, another embodiment of the present invention provides the appropriate thermal treatment process.

Although the high temperature process is required to move the defects to the silicon surface in the step of thermally treating the BPSG layer 29, the temperature must be controlled in order not to increase the junction depth. Particularly, the high-temperature thermal treatment has a problem in that the quality of the BPSG layer 29 may deteriorates, and it is possible to grow large extended defects from the implant-induced point defects in the inside of the silicon substrate 21, depending on the high-temperature thermal treatment sequence. Furthermore, high concentration implants, followed by a high temperature anneal, can lead to a high density of stacking faults.

As a result, the critical temperature for planarization of the BPSG layer 29 must be limited to a specific temperature capable of forming the shallow junction, without forming the extended defects in the inside of the silicon substrate.

In the preferred embodiment, the rapid thermal annealing process (hereinafter, referred to as a RTA process) may be used. To carry out the RTA process, a low temperature oxide layer 30 must be formed on the BPSG layer 29, preventing the boron ions therein from diffusing throughout the processing chamber in which the RTA process is performed. Accordingly, after forming the oxide layer 30 having a thickness of about 100–500 Å using the PECVD (plasma enhanced chemical vapor deposition) method, the RTA process is performed for 2–10 seconds at a temperature of 950°–1050° C. and in a nitrogen atmosphere.

Figure 3B:
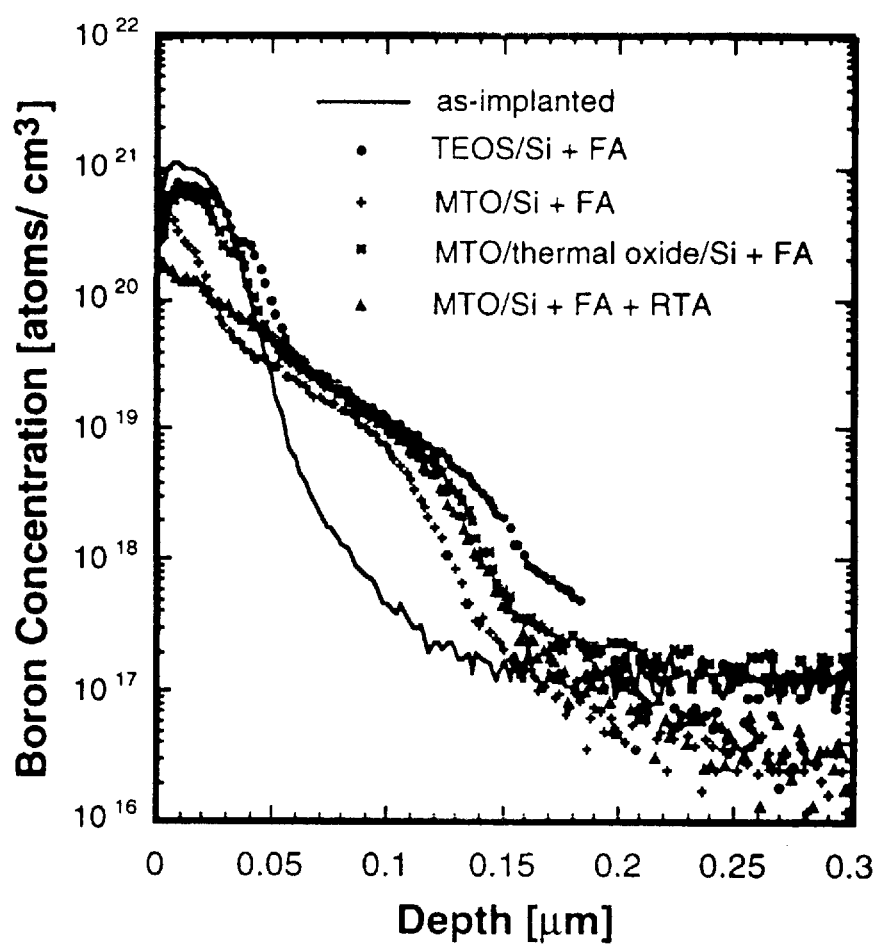
FIG. 3B is a plot showing the Boron depth profiles after the furnace annealing and RTA for the cases of various oxide layers covered on the silicon surface.

FIG. 3B is a plot showing the Boron depth profiles after the furnace annealing and RTA for the cases of various oxide layers covered on the silicon surface. As shown in FIG. 3B, the conventional thermal treatment for planarization of the BPSG layer 29 has been performed, and then the RTA process has been performed for 10 seconds at a temperature of 1000° C.; nevertheless, the junction depth of the present invention is less shallow than that of the prior art.

Table <1> shows that the RTA process has an effect on the reduction of the sheet resistance.

| Process | Sheet resistance |
| --- | --- |
| Si/TEOS + FA (850° C., 30 min) | 270 Ω/cm$^2$ |
| Si/MTO + FA | 259 Ω/cm$^2$ |
| Si/MTO + FA + RTA (1000° C., 10 sec) | 195 Ω/cm$^2$ |

Figure 4:
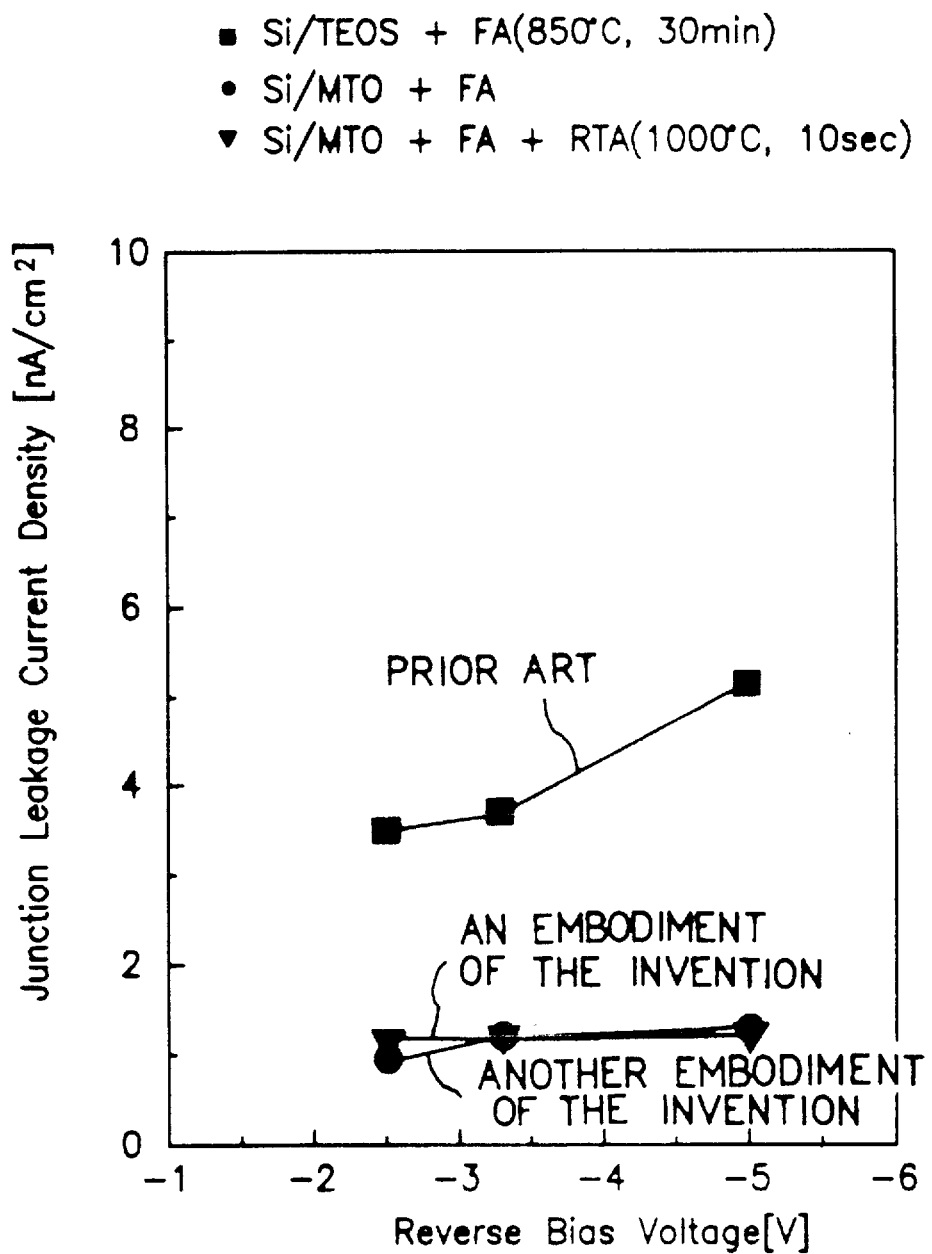
FIG. 4 is a plot of the variation of the junction leakage current to the reverse bias according to the prior art and the present invention.

FIG. 4 is a plot of the variation of the junction leakage current to the reverse bias according to the prior art and the present invention, wherein is shown a considerable reduction of the junction leakage current.

As apparent from the above statement, the present invention provides a device having a shallow junction, using a medium temperature CVD oxide layer and the furnace annealing process. Also, the present invention effectively removes the defects resulted from the ion implantation, whereby considerably improving the electrical activation which contributes to the current drivability of the device.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A method for forming a semiconductor device, comprising the steps of:
    forming a buffer oxide layer on a silicon substrate;
    implanting impurity ions into said silicon layer to form source and drain regions, wherein defects are created in said silicon substrate;
    removing said buffer oxide layer; and
    moving said defects to an upper surface of said silicon substrate by forming a CVD oxide layer, wherein said oxide layer is contacted to said source and drain regions.

2. The method of claim 1, wherein said CVD oxide layer is formed at a temperature of approximately 780° C.

3. The method of with claim 1, wherein said medium temperature CVD oxide layer is formed at a thickness of approximately 300–800 Å.

4. The method of claim 1, wherein said medium temperature CVD oxide layer is formed at a flow rate of approximately 1:50 to 1:100 for $SiH_4$ to $N_2O$.

5. The method of claim 1, wherein said buffer oxide layer is any one of a native oxide layer, an intentionally thermally grown oxide layer and a residual oxide layer.

6. A method for forming a semiconductor device, comprising the steps of:
    forming a buffer oxide layer on a silicon substrate;
    implanting impurity ions into said silicon substrate to form source and drain regions, wherein defects are created in said silicon substrate;
    removing said buffer oxide layer;
    moving said defects to an upper surface of said silicon substrate by forming a CVD oxide layer, wherein said oxide layer is contacted to said source and drain regions;
    forming an ion-doped $SiO_2$ layer on said CVD oxide layer;
    performing a thermal treatment process for planarization of said ion-doped $SiO_2$ layer;
    forming a low temperature CVD oxide layer on said ion-doped $SiO_2$ layer; and
    removing said defects moved to said upper surface of said silicon substrate by performing a rapid thermal annealing process.

7. The method of claim 6, wherein said CVD oxide layer is formed at a temperature of approximately 780° C.

8. The method of claim 6, wherein said medium temperature CVD oxide layer is formed at a thickness of approximately 300–800 Å.

9. The method of claim 6, wherein said medium temperature CVD oxide layer is formed at a flow rate of approximately 1:50 to 1:100 for $SiH_4$ to $N_2O$.

10. The method of claim 6, wherein said buffer oxide layer is any one of a native oxide layer, an intentionally thermally grown oxide layer and a residual oxide.

11. The method of claim 6, wherein said rapid thermal annealing process is performed for approximately 2–10 seconds.

12. The method of claim 11, wherein said rapid thermal annealing process is performed in a nitrogen atmosphere.

13. The method of claim 6, wherein said ion-doped $SiO_2$ layer is a BPSG layer.

14. The method of claim 6, wherein said ion-doped $SiO_2$ layer is a PSG layer.

15. The method of claim 6, wherein said low temperature CVD oxide layer is formed at a thickness of approximately 100–500 Å.

16. A method for forming a semiconductor device, comprising the steps of:

forming a gate insulating layer on a silicon substrate;

forming a gate electrode on said gate insulating layer;

forming lightly doped regions for a source and a drain by implanting low concentration ions into said silicon substrate, wherein defects are created in said silicon substrate;

forming an insulating layer on said silicon substrate;

applying an anisotropic etching process to said insulating layer, leaving a part of said insulating layer on said silicon substrate so that an insulating spacer is formed on the sidewall of said gate electrode and a buffer oxide layer is formed on the surface of said silicon substrate;

forming highly doped regions for a source and a drain by implanting high concentration ions into said silicon substrate through said buffer oxide layer, wherein defects are created in said silicon substrate;

removing said buffer oxide layer; and moving said defects to an upper surface of said silicon substrate by forming a CVD oxide layer, wherein said oxide layer is contacted to said source and drain regions.

17. The method of claim 16, wherein said CVD oxide layer is formed at a temperature of approximately 780° C.

18. A method for forming a semiconductor device, comprising the steps of:

forming a gate insulating layer on a silicon substrate;

forming a gate electrode on said gate insulating layer;

forming lightly doped regions for a source and a drain, implanting low concentration ions into said silicon substrate, wherein defects are created in said silicon substrate;

forming a insulating layer on said gate electrode and said silicon substrate;

applying an anisotropic etching process to said first insulating layer, leaving a part of said insulating layer on said silicon substrate, so that an insulating spacer is formed on the sidewall of said gate electrode and a buffer oxide layer is formed on the surface of said silicon substrate;

forming highly doped regions for said source and said drain, implanting high concentration ions into said silicon substrate through said buffer oxide layer, wherein defects are created in said silicon substrate;

removing said buffer oxide layer;

moving said defects to an upper surface of said silicon substrate by forming a CVD oxide layer, wherein said CVD oxide layer is contacted to said source and drain regions;

forming an ion-doped $SiO_2$ layer on said CVD oxide layer;

performing a thermal treatment process for planarization of said ion-doped $SiO_2$ layer;

forming a low temperature CVD oxide layer on ion-doped $SiO_2$ layer; and removing said defects moved to said upper surface of said silicon substrate by performing a rapid thermal annealing process.

19. The method of claim 18, wherein said CVD oxide layer is formed at a temperature of approximately 780° C.

20. A method for forming a semiconductor device, comprising the steps of:

providing a semiconductor substrate comprising a surface;

forming an oxide layer overlying said surface of said semiconductor substrate;

introducing impurities by implantation into said semiconductor substrate through said oxide layer to form an active region, said active region having a junction region at a first location beneath said surface, said step of introducing causing a plurality of defects in said semiconductor substrate at a second location beneath said surface, said first location being adjacent to said second location;

removing said oxide layer from said surface; and forming a medium temperature interdielectric layer on and contact with said surface, whereupon said medium temperature interdielectric layer forming step causes a substantial portion of said defects to migrate away from said first location toward said surface.

21. The method of claim 20, wherein said CVD oxide layer is formed at a temperature of approximately 780° C.

* * * * *

UNITED STATES PATENT AND TRADEMARK OFFICE
CERTIFICATE OF CORRECTION

PATENT NO. : 5,846,887
DATED : December 8, 1998
INVENTOR(S) : Lee et al.

It is certified that error appears in the above-identified patent and that said Letters Patent is hereby corrected as shown below:

In column 3, line 10, delete "structure" following "substrate".

In column 4, line 25, delete "immediately. In a sequence a medium temperature CVD" and insert -- immediately a medium temperature CVD --.

Signed and Sealed this

Seventh Day of November, 2000

*Attest:*

Q. TODD DICKINSON

*Attesting Officer*     *Director of Patents and Trademarks*